United States Patent [19]

Osawa et al.

[11] Patent Number: 5,000,831

[45] Date of Patent: Mar. 19, 1991

[54] METHOD OF PRODUCTION OF AMORPHOUS HYDROGENATED CARBON LAYER

[75] Inventors: Izumi Osawa; Shuji Iino; Hideo Hotomi, all of Osaka, Japan

[73] Assignee: Minolta Camera Kabushiki Kaisha, Osaka, Japan

[21] Appl. No.: 164,905

[22] Filed: Mar. 7, 1988

[30] Foreign Application Priority Data

Mar. 9, 1987 [JP] Japan ................................ 62-55516
Mar. 9, 1987 [JP] Japan ................................ 62-55519

[51] Int. Cl.$^5$ .............................................. C25D 9/00
[52] U.S. Cl. ..................................... 204/173; 204/168; 204/164; 430/58; 430/61; 430/132; 427/41
[58] Field of Search ..................... 204/164, 168, 173; 427/41; 430/58, 61, 132

[56] References Cited

U.S. PATENT DOCUMENTS

| | | | |
|---|---|---|---|
| 3,189,447 | 6/1965 | Neugebauer et al. | 430/77 |
| 3,573,906 | 4/1971 | Goffe | 430/58 |
| 3,820,989 | 6/1974 | Rule et al. | 430/74 |
| 3,895,944 | 7/1975 | Wiedemann et al. | 430/59 |
| 3,956,525 | 5/1976 | Yasuba | 427/41 |
| 3,992,205 | 11/1976 | Wiedemann | 430/58 |
| 4,043,812 | 8/1977 | Stolka et al. | 430/58 |
| 4,091,166 | 5/1978 | Kubacki | 427/41 |
| 4,148,637 | 4/1979 | Kubota et al. | 430/66 |
| 4,226,896 | 10/1980 | Coburn et al. | 427/41 |
| 4,334,001 | 6/1982 | Horie et al. | 430/83 |
| 4,349,617 | 9/1982 | Kawashiri et al. | 340/522 |
| 4,365,013 | 12/1982 | Ishioka et al. | 430/57 |
| 4,366,208 | 12/1982 | Akai et al. | 428/421 |
| 4,376,688 | 3/1983 | Ceasar et al. | 204/192.11 |
| 4,394,425 | 7/1983 | Shimizu et al. | 430/65 |
| 4,394,426 | 7/1983 | Shimizu et al. | 430/65 |
| 4,405,656 | 9/1983 | Shimizu et al. | 427/39 |
| 4,409,308 | 10/1983 | Shimizu et al. | 430/60 |
| 4,416,755 | 11/1983 | Ceasar et al. | 204/192.11 |
| 4,426,434 | 1/1984 | Arishima et al. | 430/128 |
| 4,430,404 | 2/1984 | Hosoya et al. | 430/58 |
| 4,451,546 | 5/1984 | Kawamura et al. | 430/69 |
| 4,451,556 | 5/1984 | Yu | 430/346 |
| 4,452,874 | 6/1984 | Ogawa et al. | 430/57 |
| 4,465,750 | 8/1984 | Ogawa et al. | 430/57 |
| 4,466,380 | 8/1984 | Jansen et al. | 118/712 |
| 4,471,042 | 9/1984 | Komatsu et al. | 430/64 |
| 4,490,450 | 12/1984 | Shimizu et al. | 430/57 |
| 4,491,626 | 1/1985 | Kawamura et al. | 430/69 |
| 4,495,262 | 1/1985 | Matsuzaki et al. | 430/58 |
| 4,510,224 | 4/1985 | Yamazaki et al. | 430/57 |
| 4,513,022 | 4/1985 | Jansen et al. | 427/39 |
| 4,513,073 | 4/1985 | Jeffrey, III et al. | 430/65 |
| 4,518,670 | 5/1985 | Matsuzaki et al. | 430/58 |
| 4,522,905 | 6/1985 | Ogawa et al. | 430/60 |
| 4,544,617 | 10/1985 | Mort et al. | 430/58 |
| 4,557,987 | 12/1985 | Shirai et al. | 430/58 |
| 4,559,289 | 12/1985 | Sunagawa et al. | 430/66 |
| 4,560,458 | 12/1985 | Ueno et al. | 204/168 |

(List continued on next page.)

FOREIGN PATENT DOCUMENTS

| | | |
|---|---|---|
| 1174171 | 12/1969 | United Kingdom . |
| 960073 | 12/1974 | Canada . |
| 194329 | 3/1985 | European Pat. Off. . |
| 3525908 | 7/1985 | Fed. Rep. of Germany . |
| 3610076 | 10/1988 | Fed. Rep. of Germany . |
| 56-62254 | 10/1979 | Japan . |
| 62-27748 | 5/1987 | Japan . |
| 62-31862 | 8/1985 | Japan . |
| 60-249155 | 5/1984 | Japan . |
| 53-23636 | 4/1978 | Japan . |
| 53-111734 | 9/1978 | Japan . |
| 59-58437 | 4/1984 | Japan . |
| 59-58432 | 4/1984 | Japan . |
| 57-64239 | 4/1982 | Japan . |
| 58-139154 | 8/1983 | Japan . |

OTHER PUBLICATIONS

Mitchell Shen and Alexis T. Bell, "A Review of Recent Advances in Plasma Engineering", Review of Recent Advances, Mar. 29, 1979.

(List continued on next page.)

Primary Examiner—John F. Niebling
Assistant Examiner—Steven P. Marquis
Attorney, Agent, or Firm—Burns, Doane, Swecker & Mathis

[57] ABSTRACT

The present invention provides a method of plasma-polymerization at low temperature (from normal temperature to about 100° C.) and that at low frequency.

12 Claims, 3 Drawing Sheets

U.S. PATENT DOCUMENTS

| | | | |
|---|---|---|---|
| 4,579,801 | 4/1986 | Yashiki | 430/60 |
| 4,592,982 | 6/1986 | Saitoh et al. | 430/57 |
| 4,598,032 | 7/1986 | Saitoh et al. | 430/58 |
| 4,634,648 | 1/1987 | Jansen et al. | 430/84 |
| 4,675,265 | 6/1987 | Kazama et al. | 430/67 |
| 4,686,164 | 8/1987 | Osawa et al. | 430/63 |
| 4,693,799 | 9/1987 | Yanagihara et al. | 204/169 |
| 4,720,444 | 1/1988 | Chen | 430/58 |
| 4,738,912 | 5/1988 | Iino et al. | 430/58 |
| 4,741,982 | 5/1988 | Iino et al. | 430/58 |
| 4,743,522 | 5/1988 | Iino et al. | 430/58 |
| 4,749,636 | 6/1988 | Iino et al. | 430/58 |
| 4,749,637 | 6/1988 | Hayashida et al. | 430/58 |
| 4,755,444 | 7/1988 | Karakida et al. | 430/66 |
| 4,770,965 | 9/1988 | Fender et al. | 430/66 |
| 4,770,966 | 9/1988 | Kazama et al. | 430/66 |
| 4,774,130 | 9/1988 | Endo et al. | 428/216 |
| 4,797,338 | 1/1989 | Iino et al. | 430/58 |
| 4,801,515 | 1/1989 | Iino et al. | 430/66 |

FOREIGN PATENT DOCUMENTS

| | | |
|---|---|---|
| 60-101541 | 6/1985 | Japan . |
| 50-30526 | 3/1975 | Japan . |
| 54-115134 | 9/1979 | Japan . |
| 61-94056 | 5/1986 | Japan . |
| 61-289355 | 6/1985 | Japan . |
| 51-46130 | 4/1976 | Japan . |
| 55-86169 | 6/1980 | Japan . |
| 56-60447 | 10/1979 | Japan . |
| 59-28161 | 8/1982 | Japan . |
| 60-125846 | 7/1985 | Japan . |
| 60-130747 | 7/1985 | Japan . |
| 61-243460 | 10/1986 | Japan . |
| 57-115552 | 1/1981 | Japan . |
| 56-150753 | 4/1980 | Japan . |
| 58-171038 | 3/1982 | Japan . |
| 58-154580 | 2/1979 | Japan . |
| 58-88753 | 11/1981 | Japan . |
| 60-67955 | 4/1985 | Japan . |
| 60-63541 | 9/1983 | Japan . |
| 60-61761 | 9/1983 | Japan . |
| 60-137977 | 7/1985 | Japan . |
| 59-136742 | 8/1984 | Japan . |
| 59-214859 | 5/1983 | Japan . |
| 48-28299 | 8/1973 | Japan . |
| 59-165054 | 9/1984 | Japan . |
| 59-38753 | 8/1982 | Japan . |
| 60-63541 | 4/1985 | Japan . |
| 59-214859 | 12/1984 | Japan . |
| 57-148745 | 9/1987 | Japan . |
| 62-222262 | 3/1986 | Japan . |
| 62-294255 | 6/1986 | Japan . |
| 58-58550 | 4/1983 | Japan . |
| 58-65440 | 4/1983 | Japan . |

OTHER PUBLICATIONS

John A. Woollam et al, "Optical and Interfacial Electronic Properties of Diamond–Like Carbon Films", Thin Solid Films, vol. 119, pp. 121–126, 1984.

W. E. Spear and P. G. Le Comber, "Electronic Properties of Substitutionally Doped Amorphous Si and Ge", Philosophical Magazine, vol. 33, No. 6, pp. 935–949, 1976.

"Photosensitive Materials for Electron Photography—OPC vs. Inorganics", Nikkei New Materials, Dec. 15, 1986.

Kobayashi et al, "Formation of an Amorphous Powder During the Polymerization of Ethylene in a Radio-Frequency Discharge", Journal of Applied Polymer Science, vol. 17, 1973, New York.

A. Dilks, S. Kaplan and A. Van Laeken, "A C–NMR Investigation of Plasma Polymerized Ethane, Ethylene, and Acetone", Journal of Applied Polymer Science, vol. 19, 1981, New York.

METHOD OF PRODUCTION OF AMORPHOUS HYDROGENATED CARBON LAYER

BACKGROUND OF THE INVENTION

This invention relates to a method of production of an amorphous hydrogenated carbon layer, which enables a layer formation around normal temperatures and its fast formation.

It is known that organic plasma-polymerization layers can be formed with various kinds of gases of organic compounds such as ethylene gas, benzene, aromatic silane compounds and so on (referring to for example, A. T. Bell, M. Shen et al., Journal of Applied Polymer Science, 17, 885 -892 (1973).

A plasma-polymerization layer, although, shows rather different properties such as layer-formative properties and layer-properties dependent on the kind of gases as raw materials, production conditions and so on.

In general, in order to form a plasma-polymerization layer excellent in hardness, damage resistance and environmental resistance by plasma-polymerization of organic compounds of hydrocarbon series, it is necessary to heat a substrate to high temperature and polymerize raw materials with high frequency around 13.56 MHz.

For the above mentioned reasons, the materials of a substrate suitable for coating of a plasma-polymerization layer are forced to be restricted and it is difficult to apply a plasma-polymerization method of organic compounds to articles constituted with materials which soften or deform at high temperature or various kinds of devices which have the possibility that the performances ma be impaired.

SUMMARY OF THE INVENTION

The object of the invention is to provide a method of production of an amorphous hydrogenated carbon layer which can be formed by plasma-polymerization of organic compounds of hydrocarbon series at low temperature (around normal temperatures to about 100° C.).

The object of the invention is achieved by polymerizing organic compounds of hydrocarbon series which have an unsaturated bond and a boiling point of within the range of between $-50°$ C. and $+15°$ C. or which have an unsaturated bond and three or four carbons in a vacuum by means of a plasma-discharge decomposition method at low frequency within the range of between 10 KHz and 1000 KHz.

DETAILED DESCRIPTION OF THE INVENTION

Figure 1:
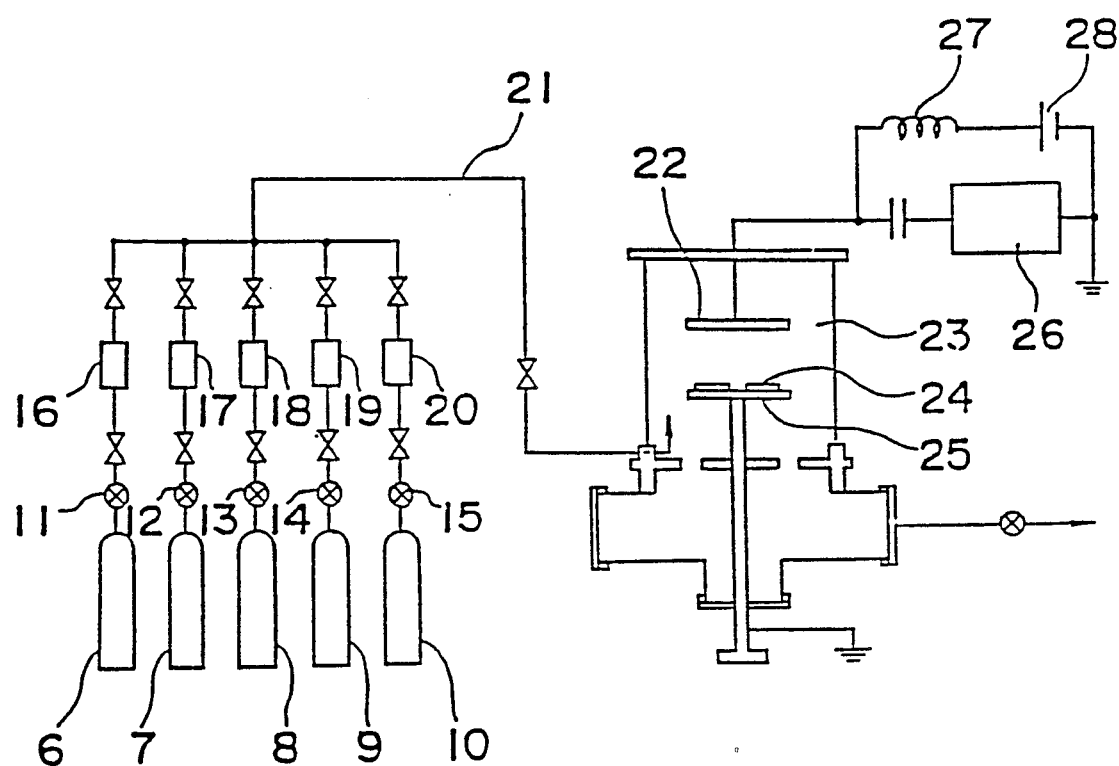
FIGS. 1 and 2 illustrate examples of a schematic view of an apparatus for the practice of the present invention.

Specified kinds of hydrocarbon have been found to be polymerized by plasma at low temperature around normal temperatures in the process of the research of the invention for a method of plasma-polymerization.

The present invention relates to a method of production of an amorphous hydrogenated carbon layer wherein organic compounds of hydrocarbon series which have an unsaturated bond and a boiling point of within the range of between $-50°$ C. and $+15°$ C. are polymerized in a vacuum by a plasma-discharge decomposition method at low frequency within the range of between 10 KHz and 1000 KHz.

The method is also achieved by the use of organic compounds of hydrocarbon series which have an unsaturated bond and three or four carbon numbers.

The method of the production of an amorphous hydrogenated carbon layer of the present invention enables the formation of the layer at low temperature (around normal temperatures) and can be applied even to articles which soften and deform at high temperature.

The method of the present invention enables the fast deposition and the formation of a layer with large size.

An amorphous hydrogenated carbon layer obtained according to the present invention is excellent in hardness and environmental resistance, and can be given other useful properties by the addition of an atom into the layer if desired.

As to organic compounds of hydrocarbon series suitable for the present invention, it is desired to have enough vapor pressure around normal temperatures and to be plasma species at low frequency. Preferred organic compounds of hydrocarbon series from the view point of boiling point are those with a boiling point within the range of between $-50°$ C. and $+15°$ C., preferably $-50°$ C. and $+0°$ C.

An organic compound of hydrocarbon series of the invention is required not only to have the above mentioned boiling point but also to have an unsaturated bond. The unsaturated bond includes a double bond or triple bond of carbon-carbon, two or more of which may be conjugated or unconjugated.

Unsaturated bonds are cut when plasma-polymerized to serve as the formation of a crosslinking structure. So a layer formed with a compound without unsaturated bonds is lacking in hardness, fragile and liable to peel off from a substrate.

Illustrative examples of the above mentioned organic compounds of hydrocarbon series suitable for the invention are propylene (bp: $-47.8°$ C.), cyclopropene(bp:$-36°$ C.), allene(bp:$-32°$ C.), methylacetylene(bp:$-27.5°$ C.), isobutylene(bp:$-6.6°$ C.), 1-butene(bp:$-6.1°$ C.), butadiene(bp:$-2.6°$ C.), 2-butene(bp: $0.96°$ C.), cyclobutene(bp:$2.0°$ C.), monovinylacetylene(bp:$5.1°$ C.), 1-butyne(bp:$8.3°$ C.), butadiyne(bp:$9.5°$ C.), methylallene(bp:$10.3°$ C.), each of which have three or four carbons. But, it is useful to notice that a compound without the above mentioned boiling point, for example, 2-butyne with a boiling point of $27°$ C. which is constituted of four carbons, can be used in the invention. Among those compounds, propylene, butadiene, butadiyne, isobutylene, in particular, butadiene are preferred.

Any of those compounds can be used singly or in combination with other compounds.

An organic compound of hydrocarbon series may also contain a halogen atom and so on.

Examples of compounds containing a halogen atom are vinyl chloride(bp:$-13.9°$ C.), chlorotrifluoroethylene (bp:$-28°$ C.), perfluoropropylene($-29°$ C.) and so on, any of which can be used singly or in combination with the aforesaid organic compounds of hydrocarbon series.

An amorphous hydrogenated corbon layer containing a halogen atom is improved in water repellancy and wear resistance. Particularly, fluorine effects the decrease of the refractive index and the prevention of reflection.

Such above mentioned organic compounds of hydrocarbon series càn be polymerized at low temperature around normal temperatures by plasma-polymerization, which can be applied to various fields.

The usage of such compounds enables the formation of an amorphous hydrogenated carbon layer by plasma polymerization at low temperature (around normal temperatures).

Therefore, the invention has various uses because the method of the invention makes it possible to coat not only various products made of ceramics or metal, which have heat resistance, but also resin such as polymethyl methacrylate poor in heat resistance or various devices which are liable to suffer deterioration in properties by heat.

If organic compounds of hydrocarbon series which have a boiling point of more than 15° C. are used, it becomes difficult to polymerize them by plasma at low temperature, because such organic compounds of hydrocarbon series having a boiling point of more than 15 ° C. are liquid at normal temperatures and necessarily are to be kept in a vaporized condition when polymerized by plasma. Therefore, the equipment such as a heater necessary for the prevention of aggregation inside a pipe or reactor etc. causes the complication of an apparatus. The above mentioned defects are also the general case with a compound constituted of more than four carbon atoms.

Further, if the lowest temperature necessary for vaporization of organic compounds is maintained, organic compounds of hydrocarbon series are not decomposed sufficiently by plasma discharge, and the formation of oily substance caused by a low degree of crosslinking results in the pollution of a substrate or a reactor.

Organic compounds of hydrocarbon series, which have a boiling point of less than −50° C., are liable to polymerize at the normal temperature to form a powdery polymer rather than to form a layer on a substrate, being poor in formative properties. It is also the general case with a compound constituted of less than three carbon atoms.

Other organic compounds of hydrocarbon series such as acetylene(bp:−81° C.), isobutane(bp:−11.73° C.), isopentane(bp:30°-30.2° C./747 mmHg), ethane(bp:−88.63° C.), ethylene(bp:−103.71° C.), cyclopropane(bp:49.26° C.), neopentane(bp:9.5° C.), butane(bp:−0.5° C.), pentane(bp:36.1° C.), propane(bp:−42.1° C.), methane(bp:−161.5° C.) and a mixture thereof may be used so far as plasma-polymerization at low temperature and low frequency are not affected adversely. The addition thereof effects hardness and translucence.

An amorphous carbon layer prepared according to the invention contains 10-60 atomic % of hydrogen on the basis of the total of the layer constituting atoms, and has the following properties;

(a) high hardness, pencil hardness of 3H or more represented by JIS-K-5400 are easily achieved.

(b) possibility of coating to various kinds of substrates and devices, and excellent adherence (c) excellent solvent resistance; being insoluble in various solvents, and alkalis.

(d) isotropic and uniform deposition, without shadow which can be seen in vapor-deposited layer.

(e) excellent environmental stability. The properties of polymer layer hardly change with time.

(f) Excellent thermal conductivity, which does not cause heat storage in a heating element such as IC.

(g) excellent high-translucency. More than 90% or more of visible light can transmit through a layer of 2 $\mu$m in thickness.

(h) excellent wear resistance; because of low friction coefficient in spite of high hardness.

(i) refractive index of about 1.3–1.6

(j) ionization potential of about 5.0–6.0 eV.

Plasma-polymerizarion is the so-called glow-discharge plasma-polymerizing reaction, that is, for example:

molecules in the vapor phase undergo discharge decomposition under reduced pressure and produce a plasma atmosphere, from which active neutral seeds or charged seeds are collected on the substrate by diffusing, electrical or magnetic guiding, etc. and deposited as a solid on the substrate through a recombination reaction.

An amorphous carbon layer is formed under plasma-condition by a plasma method at low frequency of 10–1000 KHz. The aforementioned organic compounds of hydrocarbon series can be polymerized to form an layer at low temperature around normal temperatures, and that at high speed.

Plasma-polymerization with high frequency of 1000 KHz or more progresses in the vapor phase to be liable to form an oily or powdery polymer because of the decrease of the collection numbers of radical seeds or ionic seeds generated by plasma onto a substrate and the decrease of the deposition rate.

On the other hand, if it is possible to keep a substrate at high temperature, organic compounds such as butadiene can be also polymerized at high frequency of 1000 KHz or more to form a layer without the aforementioned problems.

If plasma polymerization is carried out at low frequency of 10 KHz or less, a substrate is subjected to ionic damages in proportion to the increase of the number of radical seeds or ionic seeds which reach the substrate to form a layer which is fragile, lacking in adherence to the substrate.

An amorphous hydrogenated carbon layer may be produced by plasma-polymerization at low frequency and further in combination with an ionized vapor deposition process, a vacuum vapor deposition process or a sputtering process so for as the present invention is not affected adversely.

Figure 2:
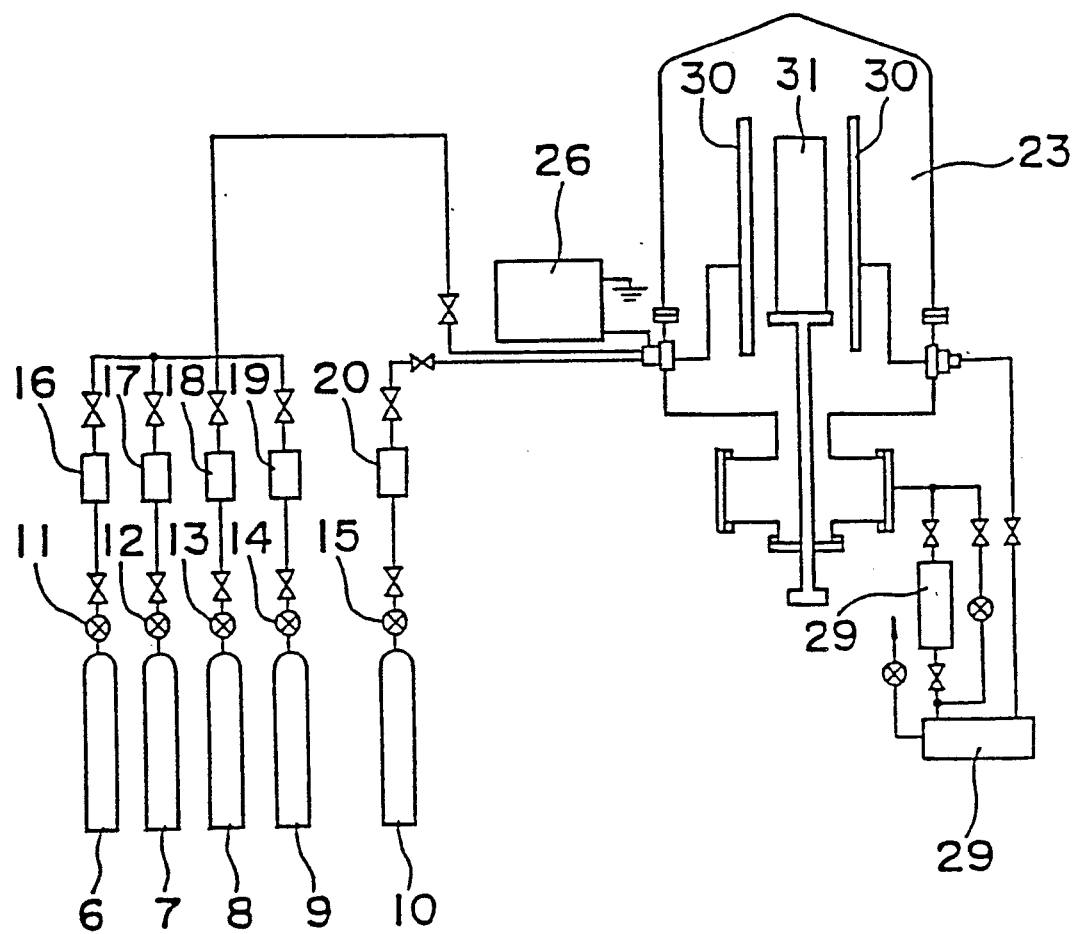

FIGS. 1 and 2 illustrate plasma CVD equipment of the capacitive coupling type for producing an amorphous hydrogenated carbon layer of the invention, FIG. 1 representing one of the parallel plate type and FIG. 2 one of the cylindrical type.

The equipment in FIG. 1 has electrodes (22), (25) and a substrate (24) of the plate-type, being different from an electrode (30) and a substrate (24) of the cylindrical type in the equipment in FIG. 2.

Plasma CVD equipment of an inductive coupling type can be used in the invention. A method of production of an amorphous hydrogenated carbon layer of the present invention is explained below as followed by the example of a plasma CVD equipment of the capacitive coupling type.

In FIG. 1, the numerals (6) through (10) denote No. 1 tank through No. 5 tank which are filled with an organic compound of hydrogen carbon series suitable for the invention and a carrier gas such as H$_2$, He, Ar, each tank connected with one of five regulating valves No. 1 through No.5 (11)–(15) and one of five flow controllers No. 1 (16) through No. 5 (20).

These gases are sent through a main pipe (21) into a reactor (23). In the reactor (23), an electrode (22) of the plate-type connected through a condenser to an electric power source (26) of low frequency are installed opposite to a grounding electrode (25) of the plate-type on which a plate-type substrate (24) is set.

The plate type electrode (22) is also connected through a coil (27) to a direct current power source (28) which further applies a direct current bias voltage to the electrode in addition to voltage applied by a low frequency power source (26).

If desired, a substrate (24) placed on an electrode (25) may be heated to, for example, within the range of between room temperature and 100° C. by means of a heater which is not shown.

When butadiene is plasma-polymerized on, for example, poly methyl methacrylate to form an amorphous hydrogenated carbon layer with a structual mechanism set up as above, the reactor (23) is reduced preliminarily to specified pressure and then provided through a main pipe (21), butadiene gas from a first tank (1) and a carrier gas $H_2$ from a second tank (2). An electric power of 30 watts is applied to a plate type electrode (22) with a low frequency power source (26) to discharge plasma between the two electrodes (23), (25) and an amorphous hydrogenated carbon layer with desired thickness is formed on a pre-heated substrate (24).

Other atoms, for example, oxygen atom, halogen atoms such as fluorine and chlorine, atoms in Group V such as nitrogen, phosphine and arsenic, atoms in Group III such as boron, aluminium, gallium and indium may be incorporated in an amorphous hydrogenated carbon layer, being incorporated by introducing the vapor of compounds constituting of those atoms from an appropriate tank to a reactor (23) and plasma-polymerizing them, together with organic compounds of hydrocarbon series. The properties of a carbon layer such as wear resistance, refractive index and polarity can be adjusted.

Other atoms can be also incorporated by bombardment of the aforementioned gass after the formation of a layer.

The incorporation of halogen atom, in particular, fluorine into an amorphous hydrogenated carbon layer effects wear resistance and water repellancy.

Examples of fluorine-containing materials are gases such as fluorine, methane fluoride, methane tetrafluoride, ethylene fluoride, ethylidene fluoride perfluoropropane. It is necessary to notice that the incorporation of fluorine gas may impair the translucence of a layer.

Other examples of compounds containing a halogen atom are perfluoropropane (bp: −39° C.), difluoropropane, difluorobutane, and so on.

Examples of compounds containing an oxygen atom are ethyl methyl ether (bp:10.8° C.), diethyl ether (bp:34.5° C.), acetone (bp56.5° C.), methylacetate and so on, which effect the stability which does not change with time.

Examples of compounds containing a nitrogen atom are buthylamine (bp:78° C.), propyl amine (bp49° C.), pyrrole (bp130°–131° C.), trimethylamine (bp:3.2°–3.8° C./746.6 mmHg) and so on, which effect the stability which does not change with time.

The addition of atoms in Group III or Group V effects the polar control related to electrical conductivity. Atoms in Group III and Group V can adjust the polarity of a layer to p-type and n-type respectively.

The properties of an amorphous hydrogenated carbon layer can be controlled by the production conditions such as the kinds of starting raw materials, kinds of additive gases, the ratio of raw material gases to diluting gases ($H_2$, inactive gases), electric power frequency, pressure, temperature of substrate, DC bias voltage, annealing temperature, and discharging frequency.

Such conditions should be selected appropriately according to the objects coated with an amorphous hydrogenated carbon layer of the invention so that desired properties such as hardness translucence may be obtained. If a carbon layer with high hardness is desired, it is effective to vary formative conditions by raising the electric power at low frequency, decreasing frequency of electric power, raising the temperature of a substrate so far as the objects of the invention are impaired.

If the translucence of a layer is desired to be improved, it is effective to adjust the aforementioned conditions in reverse.

The incorporation of silicon or germanium effects the formation of an amorphous hydrogenated carbon layer with a high refractive index.

Examples of silicon souces are $SiH_4$ gas, $Si_2H_6$ gas and so on. Examples of germanium are $GeH_4$ gas, $Ge_2H_6$ gas and so on.

The addition of atoms in Group III or Group V effects the polar control related to electrical conductivity. Atoms in Group III and Group V can adjust the polarity of a layer to p-type and n-type respectively.

Examples of atoms in Group III are B, Al, Ga, In etc. As to boron containing-compounds $B(OC_2H_5)_3$, $B_2H_6$, $BCl_3$, $BBr_3$, $BF_3$ are exemplified.

As to aluminium containing-compounds, $Al(Oi-C_3H_7)_3$, $(CH_3)_3Al$, $(C_2H_5)Al$, $(i-C_4H_8)_3Al$, $AlCl_3$ and so on are exemplified.

As to Gallium-containing compound, $Ga(Oi-C_3H_7)_3$, $(CH_3)_3Ga$, $(C_2H_5)_3Ga$, $GaCl_3$, $GaBr_3$ and so on are exemplified.

As to indium-containing compounds, $In(Oi-C_3H_7)_3$, $(C_2H_5)_3In$ and so on are exemplified.

Examples of atoms in Group V are P, As, Sb, etc.

As to phosphorous-containing compounds, $PO(OCH_3)_3$, $(C_2H_5)_3P$, $Ph_3$, $PF_5$, $POCl_3$ and so on are exemplified.

As to arsenic-containing compounds, $AsH_3$, $AsCl_3$, $AsBr_3$ and so on are exemplified.

As to antimony-containing compounds, $Sb(OC_2H_5)_3$, $SbCl_3$, $SbH_3$ and so on are exemplified.

The content of the aforementioned halogen atoms, atoms in Group III, atoms in Group V may be adjusted appropriately according to the uses of an amorphous hydrogenated carbon layer.

The content thereof can be adjusted by, for example, the control of the flow rate of the additive compounds into a reactor.

The content of atoms in an obtained carbon layer can be measured by infrared absorption spectrum, $^1$H-NMR, $^{13}$C-NMR, elemental analysis, Auger analysis and so on.

EXAMPLES 1-6 and COMPARATIVE EXAMPLES 1-6

Layer-formative experiment onto various substrate

A layer was formed on various kinds of substrates of (a)-(p) described below under six conditions. (examples 1-6) shown in Table 1, using a production apparatus shown in FIG. 1.

A layer was formed under conditions outside those of the invention in order to compare with the examples. The results are also shown in Table 1 (comparative examples 1-6).

(kind of substrate)

(a) glass (#7059, made by Corning)
(b) silicon wafer
(c) aluminium plate (A 6063)
(d) aluminium plate (A 5386)
(e) stainless plate
(f) glass plate vapor-deposited by aluminium
(g) chrome-sputtered glass plate
(h) glass plate vapor-deposited by gold
(i) tungsten wire
(j) copper plate
(k) aluminium plate vapor-deposited by $As_2Se_3$
(l) GD aluminium plate built-up by a-Si
(m) aluminium plate sprayed by polyester resin (V-200, made by TOYOBO Co.)
(n) aluminium plate sprayed by polycarbonate resin (K-1300, made by Teijin Kasei Co.)
(o) aluminium plate sprayed by methyl methacrylate PMMA (BR-85, made by Mitsubishi Reiyon Co.)
(p) aluminium plate sprayed by polyarylate (U-4000, made by Yunitica Co.)

(layer-formation)

In a system of glow discharge decomposition with equipment as illustrated in FIG. 1, first the reaction chamber (23) interior was evacuated to a high level of approximately $10^{-6}$ Torr, and then by opening No. 1 and No. 2 regulating valves (11) and (12), a raw material gas from No. 1 tank (6) and $H_2$ gas from No. 2 tank (7) were led into mass flow controllers (16) and (17), so that the gases might be led into reaction chamber (23) at the flow rate shown in Table 1.

After the respective flows had stabilized, the internal pressure of the reaction chamber (23) was adjusted to a value shown in Table 1. On the other hand, the electrically conductive substrate (24), which was (a)-(p) above mentioned, was preliminarily heated up to the temperature shown in Table 1, and while the gas flows and the internal pressure were stabilized, the low frequency power source (26) was turned on and the power and frequency shown in Table 1 were applied to a plate-type electrode (22). After plasma polymerization for a specified time shown in Table 1, an amorphous hydrogenated-carbon layer was formed on the substrate (24).

Layer-formative properties to various kinds of substrates were evaluated to show o and x in Table 1.

The mark o means that the obtained layer is excellent in adhesivity judging from 10 points in the cross-cut adhesion test of JIS-K-5400.

The mark x means that the obtained layer is oily or powdery and liable to separate from the substrate.

TABLE 1

|  | example 1 | example 2 | example 3 |
|---|---|---|---|
| RM*1 | butadiene | propylene | butadiene |
| BP*2 (°C.) | −2.6 | −47.8 | 9.5 |
| USB*3 | possession | possession | possession |
| FR*4 (sccm) | 60 | 60 | 30 |
| H2FR*5 (sccm) | 60 | 60 | 60 |
| Pow*6 (W) | 100 | 80 | 50 |
| Fr*7 (Hz) | 200K | 100K | 50K |
| Pre*8 (Torr) | 2.0 | 1.0 | 0.5 |
| T*9 (°C.) | 50 | 60 | 60 |
| Time*10 (minute) | 10 | 10 | 2 |
| Thickness*11 (μm) | 1 | 1.5 | 1.5 |
| a | o | o | o |
| b | o | o | o |
| c | o | o | o |
| d | o | o | o |
| e | o | o | o |
| f | o | o | o |
| g | o | o | o |
| h | o | o | o |
| i | o | o | o |
| j | o | o | o |
| k | o | o | o |
| l | o | o | o |
| m | o | o | o |
| n | o | o | o |
| o | o | o | o |
| p | o | o | o |

|  | example 4 | example 5 | example 6 |
|---|---|---|---|
| RM*1 | butadiene | butadiene | isobutylene |
| BP*2 (°C.) | −2.6 | −2.6 | −6.6 |
| USB*3 | possession | possession | possession |
| FR*4 (sccm) | 60 | 60 | 30 |
| H2FR*5 (sccm) | 60 | 60 | 40 |
| Pow*6 (W) | 60 | 70 | 50 |
| Fr*7 (Hz) | 10K | 1000K | 50K |
| Pre*8 (Torr) | 1.5 | 0.8 | 0.5 |
| Temp*9 (°C.) | 50 | 40 | 60 |
| Time*10 (minute) | 10 | 10 | 10 |
| Thickness*11 (μm) | 2 | 0.8 | 1.5 |
| a | o | o | o |
| b | o | o | o |
| c | o | o | o |
| d | o | o | o |
| e | o | o | o |
| f | o | o | o |
| g | o | o | o |
| h | o | o | o |
| i | o | o | o |
| j | o | o | o |
| k | o | o | o |
| l | o | o | o |
| m | o | o | o |
| n | o | o | o |
| o | o | o | o |
| p | o | o | o |

|  | comparative example 1 | comparative example 2 | comparative example 3 |
|---|---|---|---|
| RM*1 | butadiene | butadiene | propane |
| BP*2 (°C.) | −2.6 | −2.6 | −42.1 |
| USB*3 | possession | possession | none |
| FR*4 (sccm) | 60 | 60 | 60 |
| H2FR*5 (sccm) | 60 | 60 | 60 |
| Pow*6 (W) | 60 | 50 | 100 |
| Fr*7 (Hz) | 13.56M | 5K | 200K |
| Pre*8 | 1.5 | 1.0 | 2.0 |

TABLE 1-continued

| | | | |
|---|---|---|---|
| (Torr) | | | |
| Temp*9 (°C.) | 50 | 40 | 50 |
| Time*10 (minute) | 10 | 10 | 4 |
| Thickness*11 (μm) | — | 1.5 | 0.05 |
| a | x*A | o | o |
| b | x | o | x*B |
| c | x | x*B | x |
| d | x | x | x |
| e | x | x | x |
| f | x | x | x |
| g | x | x | x |
| h | x | x | x |
| i | x | x | x |
| j | x | x | x |
| k | x | x | x |
| l | x | o | x |
| m | x | o | o |
| n | x | o | o |
| o | x | o | o |
| p | x | o | o |

| | comparative example 4 | comparative example 5 | comparative example 6 |
|---|---|---|---|
| RM*1 | ethylene | pentadiene | ethane |
| BP*2 (°C.) | −105 | 26.2 | 2 |
| USB*3 | possession | possession | none |
| FR*4 (sccm) | 60 | 0.1 | 60 |
| H2FR*5 (sccm) | 60 | unsufficient vapor pressure*12 | 60 |
| Pow*6 (W) | 80 | | 80 |
| Fr*7 (Hz) | 100K | | 100K |
| Pre*8 (Torr) | 1.0 | | 1.0 |
| Temp*9 (°C.) | 40 | — | 60 |
| Time*10 (minute) | 10 | | 20 |
| Thickness*11 (μm) | 0.07 | — | 0.05 |
| a | x*C | | o |
| b | x | | o |
| c | x | | x*B |
| d | x | | x |
| e | x | | x |
| f | x | | x |
| g | x | can | x |
| h | | not | |
| i | | built | |
| j | | up | |
| k | x | | x |
| l | x | | x |
| m | x | | o |
| n | x | | o |
| o | x | | o |
| p | x | | o |

*1 raw materials
*2 boiling point
*3 unsaturated bonding
*4 flow rate of raw materials
*5 flow rate of H2
*6 power
*7 frequency
*8 pressure
*9 temperature of substrate
*10 time of polymerization
*11 thickness of layer
*12 raw material gas aggregated in pipes although the gas bombs were heated
*A oily
*B peeling
*C powdery

EXAMPLE 7

Application to a surface protective layer for organic photosensitive member of electrophotography (minus chargeable)

Chloro-diane-blue(CDB) as bisago pigments of 1 g, Polyester resin (V-200, made by TOYOBO Co.) of 1 g, and cyclohexanone of 98 g were mixed and dispersed for 13 hours with a sand grinder.

A cylindrical aluminium substrate of 80 mm (diameter)×330 mm (length) was dipped in the dispersion solution so that a charge generating layer of 0.3 μm in thickness after drying is formed.

Then, 4-diethylaminobenzaldehyde-diphenylhydrazone (DEH) of 5 g and polycarbonate (K-1300, made by Teijin Kasei Co.) of 5 g were dissolved in THF of 30 g and the solution was applied on the charge generating layer so that a charge transporting layer of 15 μm in thickness after drying is formed. Thus, an organic photosensitive member was prepared.

An amorphous hydrogenated carbon layer was formed on the above obtained photosensitive member as a protective layer as similarly as Example 1 using butadiene (bp−2.6° C.) as a raw material. The formative conditions are described below.

| | |
|---|---|
| temperature of substrate | 50° C. |
| flow rate of butadiene | 60 sccm |
| flow rate of hydrogen | 300 sccm |
| electric power | 50 W |
| frequency of electric power | 50 KHZ |
| time of formation | 4 minutes |
| used apparatus | FIG. 2 |

Figure 3:
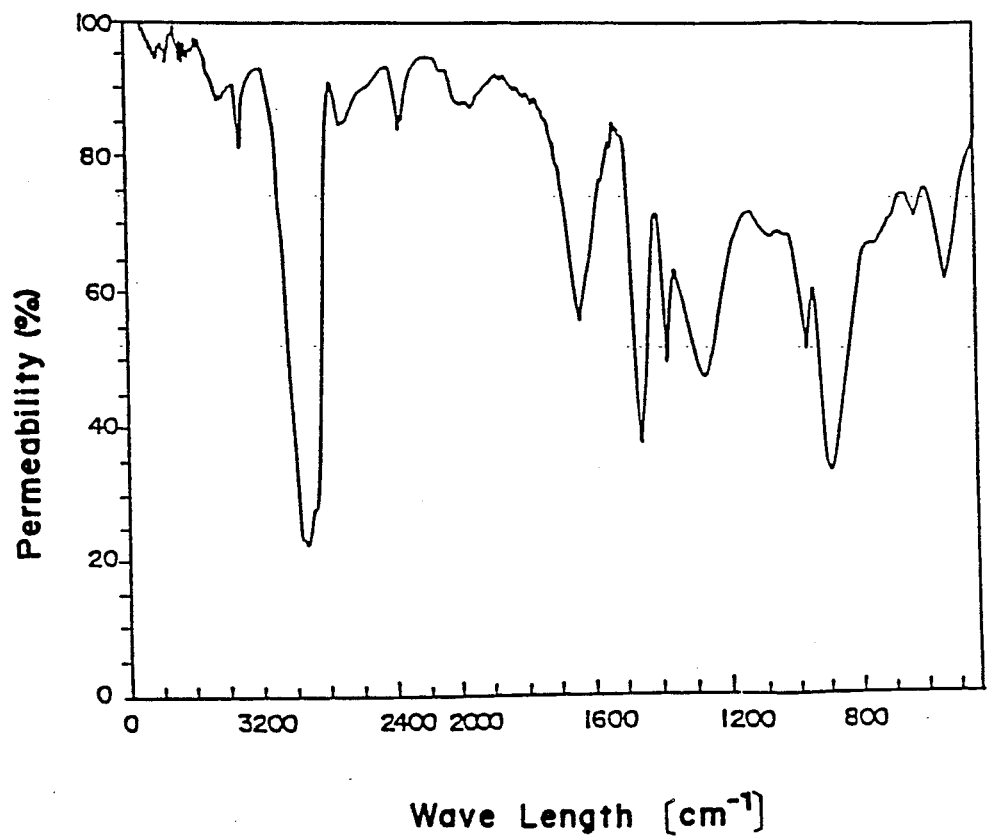
FIG. 3 shows an example of infrared absorption spectrum of a carbon layer of the invention.

The infrared absorption spectrum of the obtained surface-protective layer is shown in FIG. 3 and the properties thereof are described below;

| | |
|---|---|
| thickness of layer | 0.5 μm |
| hardness | 6 H or more (on a glass) |
| percent transmission of visible light | 90% or more |
| X-ray diffraction | no peak |
| optical band gap | 2.2 eV |
| refractive index | 1.4 |
| ionization potential | 5.5 eV |
| hydrogen amount | 43 atomic % (against all atoms constituting O.C. layer) |

According to the invention, an amorphous hydrogenated carbon layer can be also formed on an organic photosensitive member lacking in heat resistance as a surface protective layer.

According to an usual Carlson Process, a white light exposure amount for half reduction of surface potential (called simply $E_{178}$ hereinafter) was measured, which is an exposure amount necessary for reducing surface potential of a photosensitive member charged at the level of −600 V by corona discharge to half of the surface potential.

$E_\frac{1}{2}$ was 2.0 lux sec, and residual potential was 15 V. Pencil hardness of the surface was about 3H or more of JIS-K-5400.

An actually used copier was furnished with the photosensitive member, which was subjected to a copying resistant test, It was found that the visible reduction of the layer thickness was not recognized after the copying resistant test of 50,000 papers of A4 in size and the static properties were maintained. Image flow was not recognized even at high humidity and so was the filming generation.

In order to compare an organic photosensitive member which did not have a surface-protective layer with that above mentioned, it was charged at the level of $-600$ V by corona discharge according to an usual Carlson Process and $E_{\frac{1}{2}}$ was measured to obtain 2.0 lux sec. The residual potential was $-5$ V. Pencil hardness of the surface was about 5B of JIS-K-5400.

Further, an actually used copier was furnished with the comparative photosensitive member, which was subjected to a copying resistant test. The reduction of layer thickness of 1 μm was observed after the copying resistant test of 5,000 papers of A4 in size.

A surface protective layer was prepared using methane gas instead of butadiene under the conditions of substrate-temperature of 50° C. and methane flow of 60 sccm. A layer, although, was not formed and so the layer thickness could not be measured. Particles were built up on the substrate and in the bell-jar type reaction. On the other hand, the preparation of a surface protective layer was tried at the substrate temperature of 200° C. to see only a few layers formed. But, the photosensitive layer was deteriorated and $E_{\frac{1}{2}}$ could not be measured.

EXAMPLE 8

Surface protective layer for organic photosensitive member of electrophotography (plus-chargeable)

The preventive effects of surface charge injection by means of the addition of phosphorus as well as wear resistance was put to the test in the example.

| Copper-Phthalocyanine (made by Toyo Ink Co.) | 25 parts by weight |
| resin*[1] | 50 parts by weight |
| charge transporting material*[2] | 25 parts by weight |

*[1] thermosetting resin consisting of a mixture of acrylic resin (A 405; made by Dainippon Ink Co.) with melamine resin (UVAN 20HS; made by Mitsui Touatsu Co.)
*[2] compound with the following structural formula;

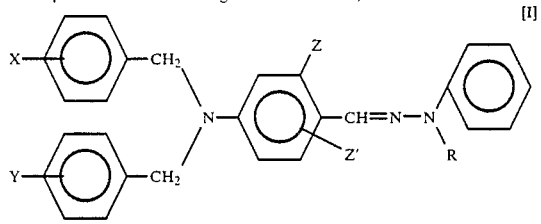

[I]

wherein X and Y represent independently hydrogen, a lower alkyl group, a methoxy group or an ethoxy group, Z represents a lower alkyl group, a benzyl group, a lower alkoxy group, a phenoxy group, or a benzyloxy group, Z' represents hydrogen, an alkyl group or an alkoxy group, R represents a lower alkyl group, an aryl group which may have a substituent or a benzyl group.

The compositions were ground and mixed for 12 hours. The mixture was sprayed on a cylindrical aluminium substrate (80 mm in diameter × 330 mm in length) to prepare a photosensitive member so that the thickness thereof may be 17 μm after baked at 120° C. for 1 hour.

An amorphous hydrogenated carbon layer was formed on the above obtained photosensitive member as a protective layer in a similar way as example 1 using propylene (bp; $-47.88°$ C.) as a raw material. The carbon layer was made to contain phosphorus in the present example. The layer formative conditions are described below;

| temperature of substrate | 80° C. |
| flow rate of propylene | 60 sccm |
| flow rate of hydrogen | 50 sccm |
| flow rate of phosphine (PH$_3$) (diluted to 10% by hydrogen) | 250 sccm |
| electric power | 50 W |
| frequency of electric power | 100 KHZz |
| pressure | 1 Torr |
| time for formation | 4 minutes |
| used apparatus | FIG. 2 |

The properties of the obtained surface-protective layer were as follows;

| layer thickness | 0.4 μm |
| hardness | 6 H or more (on a glass) |
| percent transmission of visible light | 90% or more |
| X-ray diffraction | no peak |
| composition (C:H:P) | 51:43:6 (atomic %) |

The obtained photosensitive member was charged at the level of $+600$ V by corona discharge according to a usual Carlson Process and $E_{\frac{1}{2}}$ was measured to obtain 4.6 lux sec. The residual potential was $+10$ V. Pencil hardness of the surface was about 5H or more of JIS-K-5400.

An actually used copier was furnished with the photosensitive member, which was subjected to copying resistant test. It was found that visible reduction of the layer thickness was not recognized after the copying resistant test of 50,000 papers of A4 in size and the static properties were maintained. Image flow was not recognized even at high humidity and so was the filming generation.

In order to compare an organic photosensitive member which did not have a surface-protective layer with that above mentioned, it was charged at the level of $+600$ V by corona discharge according to a usual Carlson Process and $E_{\frac{1}{2}}$ was measured to obtain 4.5 lux sec. The residual potential was $+5$ V. Pencil hardness of the surface was about HB of JIS-K-5400.

Further, an actually used copier was furnished with the comparative photosensitive member, which was subjected to a copying resistant test. The reduction of layer thickness of 1 μm was observed after the copying resistant test of 7,000 papers of A4 in size.

A surface protective layer was attempted using hexane instead of propylene gas, but few layers were formed because the raw material gas could not be sent into the bell jar reactor on account of very low vapor pressure.

EXAMPLE 9

Surface protective layer for As$_2$Se$_3$ photosensitive member

A photosensitive member consisting of As$_2$Se$_3$ alloy was prepared according to a conventional vacuum deposition method.

An amorphous hydrogenated carbon layer was formed on the photosensitive member as a protective layer in a similar was as Example 1. The layer formative conditions are described below.

| | |
|---|---|
| temperature of substrate | 60° C. |
| flow rate of butadiene | 60 sccm |
| flow rate of phosphine (PH$_3$) | 250 sccm |
| flow rate of hydrogen | 50 sccm |
| electric power | 50 W |
| frequency of electric power | 50 KHz |
| pressure | 0.7 Torr |
| time | 3 minutes |
| apparatus | FIG. 2 |

The obtained photosensitive member was charged at the level of +600 V by corona discharge according to a usual Carlson Process and E$_{\frac{1}{2}}$ was measured to obtain 1.1 lux sec. The residual potential was +10 V. Pencil hardness of the surface was about 6H or more of JIS-K-5400.

An actually used copier was furnished with the photosensitive member, which was subjected to a copying resistant test. It was found that visible reduction of the layer thickness was not recognized after the copying resistant test of 50,000 papers of A4 in size and the static properties were maintained. Image flow was not recognized even at high humidity and so was the filming generation.

In order to compare an As$_2$Se$_3$ photosensitive member which did not have a surface-protective layer with that above mentioned, it was charged at the level of +600 V by corona discharge according to a usual Carlson Process and E$_{\frac{1}{2}}$ was measured to obtain 1.1 lux sec. The residual potential was +5 V. Pencil hardness of the surface was about H of JIS-K-5400.

Further, an actually used copier was furnished with the comparative photosensitive member, which was subjected to a copying resistant test of 50,000 papers of A4 in size.

The filming generation resulted in the deterioration of sensitivity (1.8 lux sec) and the damages of surface caused image noises.

A surface protective layer was prepared using butane and sytrene instead of butadiene under the conditions of substrate-temperature of 50° C. and each a gas flow of 60 sccm.

A layer forming rate was slow with the use of butane and a layer with only 0.1 μm in thickness was formed and the layer began to peel off gradually from the substrate after taken into the atmosphere and completely peeled off the following day.

A layer could not be formed with the use of styrene because of the lack of vapor pressure. Although the bomb of styrene was heated, the aggregation of styrene monomer inside a non-heated pipe caused problems with the apparatus.

EXAMPLE 10

Protective layer for plastic lens

A plasma-polymerized layer was formed on a surface of plastic lens made of poly-methyl methacrylate (PMMA)(70° C. of heat resistance) in a similar way as Example 1. The formative conditions are described below.

| | |
|---|---|
| temperature of substrate | 40° C. |
| flow rate of butadiene | 60 sccm |
| flow rate of hydrogen | 60 sccm |
| electric power | 100 W |
| frequency | 200 KHz |
| Pressure | 2 Torr |
| time | 1 minute |
| apparatus | FIG. 1 |

The protective layer thus obtained had 3000 Å in thickness.

The initial properties of lens such as translucence, brightness (F value) and surface precision were maintained well.

The surface hardness was improved from 3B to 4H and PMMA did not elute from the surface when scrubbed with ether.

EXAMPLE 11

Surface protective layer of thermal head

A plasma-polymerized layer of butadiene was formed on a surface of a thermal head consisting of tantalum nitride as a heater element in a similar way as Example 1. The formative conditions are described below.

| | |
|---|---|
| temperature of substrate | 50° C. |
| flow rate of butadiene | 60 sccm |
| flow rate of hydrogen | 60 sccm |
| electric power | 50 W |
| frequency of electric power | 100 KHz |
| pressure | 1 Torr |
| time | 5 minutes |
| apparatus | FIG. 1 |

The protective layer thus obtained had 1 μm in thickness.

The obtained thermal head was excellent in heat release properties and durability and showed less image bleedings than conventional thermal heads consisting of SiO$_2$ or Al$_2$O$_3$.

EXAMPLE 12

Surface protective layer for optical disk

A plasma-polymerized layer of butadiene was formed on the surface of an optical disk prepared by sputtering a Te target in a methane gas atmosphere, in a similar way as Example 1 while the the disk was floated between electrodes (22) and (25) shown in FIG. 1. The formative conditions are described below.

| | |
|---|---|
| temperature of substrate | 50° C. |
| flow rate of butadiene | 100 sccm |
| flow rate of hydrogen | 60 sccm |
| electric power | 70 W |
| frequency of electric power | 100 KHz |
| pressure | 0.5 Torr |
| time | 1 minute |
| apparatus | FIG. 1 |

The protective layer thus obtained had 0.8 μm in thickness.

The obtained optical disk was improved in warpage of the substrate and prevention of reading errors.

EXAMPLE 13

Surface protective layer for optomagnetic disk

An amorphous hydrogenated carbon layer was formed as a surface protective layer on a surface of optomagnetic disk which has a magnetic layer on a polycarbonate substrate prepared by sputtering TbFeCo in a similar way and condition as Example 12.

The obtained optomagnetic disk had improved in humidity resistance, oxdation resistance and long life.

EXAMPLE 14

Surface protective layer for magnetic disk

A magnetic layer consisting of cobalt-nickel-chromium was prepared on an aluminium substrate to obtain a hard disk. The surface was protected with a butadiene-layer as similarly as Example 7.

The obtained head was subjected to a test of resistance to wear. A slash in the disk without a protective layer was seen after contacted $10^5$ times with a magnetic head, but a slash could not be seen with a protective layer. The oxidative resistance and the life were also improved.

The addition of fluorine atom effected decrease of frictional force with a head.

EXAMPLE 15

Application to solar cell

A solar cell of pin-type of a Si was prepared using the apparatus of FIG. 1. A p-layer, i-layer and n-layer were laminated on a aluminium substrate in the order.

|  | p-layer | i-layer | n-layer |
| --- | --- | --- | --- |
| SiH$_4$ | 100 sccm | 100 sccm | 100 sccm |
| B$_2$H$_6$ diluted to 400 ppm with hydrogen | 25 sccm | 0 sccm | 0 sccm |
| B$_2$H$_6$ diluted to 3 ppm with hydrogen | 0 sccm | 40 sccm | 0 sccm |
| PH$_3$ diluted to 400 ppm with hydrogen | 0 sccm | 0 sccm | 200 sccm |
| H$_2$ | 275 sccm | 260 sccm | 100 sccm |
| layer thickness | 300 Å | 4000 Å | 200 Å |
| electric power | 100 W | 100 W | 100 W |
| pressure | 1 Torr | 1 Torr | 1 Torr |
| frequency | 13.56 MHz | 13.56 MHz | 13.56 MHz |

An ITO electrode was formed on the laminated layer to prepare a solar cell, which showed the conversion efficiency of 2.1% (Am-1; light source).

A protective layer was formed on the surface of the solar cell by plasma-polymerization of butadiene in a similar way and conditions as Example 1.

| | |
| --- | --- |
| temperature of substrate | 100° C. |
| flow rate of butadiene | 100 sccm |
| flow rate of hydrogen | 100 sccm |
| electric power | 80 W |
| frequency | 200 KHz |
| pressure | 1 Torr |
| time | 5 minutes |
| apparatus | FIG. 1 |

The obtained protective layer had 2000 Å in thickness and 1.48 in refractive index. The conversion efficiency was improved to 2.7%, and the layer was found to be useful as an

EXAMPLE 16

Undercoat layer for organic photosensitive member

A vapor deposited of 500 Å in thickness consisting of aluminium chlorophthalocyanine chloride (AlClPc(Cl)) on an aluminium substrate. A charge transporting layer was formed on the layer by spraying the same charge transporting material as used in Example 8.

A laser printer was furnished with the obtained photosensitive member which was put to use of reverse development.

Interfacial defects between the vapor deposited layer and Al caused injection of charges and image noises, so called black spots.

When a carbon layer was formed before vacuum deposition, there were no black spots. It is understood that the carbon layer as an undercoat layer effects the prevention of charge injection from a substrate.

EXAMPLE 17

Application to charge transporting layer for photosensitive member.

AlClPc(Cl) was vapor deposited up to 2000 Å in thickness on an aluminium substrate.

A plasma polymerized layer (to which boron was added) of butadiene in a similar way as Example 1. The formative conditions were described below;

| | |
| --- | --- |
| temperature of substrate | 60° C. |
| flow rate of butadiene | 120 sccm |
| flow rate of hydrogen | 100 sccm |
| B$_2$H$_6$ (diluted to 10% with hydrogen) | 120 sccm |
| electric power | 50 W |
| frequency | 50 KHz |
| pressure | 0.5 Torr |
| time | 40 minutes |
| apparatus | FIG. 1 |

The charge transporting layer thus obtained had 12 μm in thickness, and the composition thereof was C:B:H=50:7:43(atomic %).

As to photosensitive properties, initially charged potential was −600 V, E$_{\frac{1}{2}}$ was 2.3 lux sec and the layer hardness was 6H or more.

EXAMPLE 18

Surface protective layer for IC

A surface protective layer for IC was formed in a similar way as Example 12. The IC worked well without the storage of heat.

EXAMPLE 19

Coating on image sensor

A protective layer was formed on an image sensor of sealing type in a similar way as Example 11. It was good in wear resistance and the durability was improved.

What is claimed is:

1. A method of production of an amorphous hydrogenated carbon layer for a photosensitive member, which comprises:

(a) forming a photosensitive layer on a substrate;

(b) introducing organic compounds of hydrocarbon series which have an unsaturated bond and a boiling point within the range of from between −50° C. and +15° C., and maintaining a temperature of the substrate to be less than 100° C.;

(c) decomposing the organic compounds into radical seeds or ionic seeds by a plasma-discharge with low frequency within the range of from between 10 KHz and 1000 KHz; and (d) depositing said radical seeds of said ionic seeds on a surface of the photosensitive layer, thereby an amorphous hydrogenated carbon layer is formed at the most external surface of the photosensitive member.

2. A method of production of an amorphous hydrogenated carbon layer of claim 1, wherein said organic compounds of hydrocarbon series have three or four carbon members.

3. A method of production of an amorphous hydrogenated carbon layer of claim 1, wherein the photosensitive layer includes organic photosensitive material.

4. A method of production of amorphous hydrogenated carbon layer of claim 1, wherein the photosensitive layer comprises a charge generating layer which comprises a charge generating material and a charge transporting layer which comprises a charge transporting material and a binder resin.

5. A method of production of an amorphous hydrogenated carbon layer of claim 1, wherein the photosensitive layer is formed by an $As_2Se_3$ alloy.

6. A method of production of an amorphous hydrogenated carbon layer of claim 1, wherein the organic compounds of hydrocarbon series are selected from the group consisting of propylene (bp: −47.8° C.), cyclopropene (bp:−36° C.), allene (bp:−32° C.), methylacetylene (bp:−27.5° C.), isobutylene (bp:−6.6° C.), 1-butene (bp:−6.1° C.), butadiene (bp:−2.6° C.), 2-butene (bp:0.96° C.), cyclobutene (bp:2.0° C.), monovinylacetylene (bp:5.1° C.), 1-butyne (bp:8.3° C.), butadiyne (bp:9.5° C.), methylallene (bp:10.3° C.), vinyl chloride (bp:−13.9° C.), chlorotrifluoroethylene (bp:−28° C.), perfluoropropylene (bp:−29° C.) and a mixture thereof.

7. A method of production of an amorphous hydrogenated carbon layer of claim 1, wherein the organic compounds of hydrogencarbon series are plasma-polymerized together with halogen atom containing compounds.

8. A method of production of an amorphous hydrogenated carbon layer of claim 7, wherein the halogen containing compounds are selected from the group consisting of vinyl chloride (bp:−13.9° C.), chlorotrifluoroethylene (bp:−28° C.) and a mixture thereof.

9. A method of production of an amorphous hydrogenated carbon layer of claim 1, wherein the organic compounds of hydrogencarbon series are plasma-polymerized together with boron containing compounds.

10. A method of production of an amorphous hydrogenated carbon layer of claim 9, wherein the boron containing compounds are selected from the group consisting of $B(OC_2H_5)_3$, $B_2H_6$, $B_2Cl_3$, $BBr_3$, $BF_3$ and a mixture thereof.

11. A method of production of an amorphous hydrogenated carbon layer of claim 1, wherein the organic compounds of hydrogencarbon series are plasma-polymerized together with phosphorous containing compounds.

12. A method of production of an amorphous hydrogenated carbon layer of claim 11, wherein the phosphorous containing compounds are selected from the group consisting of $PO(OCH_3)_3$, $(C_2H_5)_3P$, $PH_3$, $PF_5$, $POCl_3$ and a mixture thereof.

* * * * *